United States Patent
Hsu et al.

(10) Patent No.: US 12,308,086 B2
(45) Date of Patent: May 20, 2025

(54) SYSTEM AND METHOD FOR TESTING MEMORY DEVICE

(71) Applicant: NANYA TECHNOLOGY CORPORATION, New Taipei (TW)

(72) Inventors: Jui-Chung Hsu, Pingtung County (TW); Wan-Chun Fang, Taoyuan (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 0 days.

(21) Appl. No.: 18/206,772

(22) Filed: Jun. 7, 2023

(65) Prior Publication Data

US 2024/0412800 A1 Dec. 12, 2024

(51) Int. Cl.
*G11C 29/38* (2006.01)
*G11C 29/12* (2006.01)

(52) U.S. Cl.
CPC ........ *G11C 29/38* (2013.01); *G11C 29/12005* (2013.01)

(58) Field of Classification Search
CPC .......................... G11C 29/38; G11C 29/12005
USPC ........................................ 714/718, 719, 724
See application file for complete search history.

(56) References Cited

U.S. PATENT DOCUMENTS

| | | | | |
|---|---|---|---|---|
| 6,019,502 A | * | 2/2000 | Baeg | G01R 31/3185 714/718 |
| 9,607,715 B1 | * | 3/2017 | Botea | G11C 29/08 |
| 2005/0068810 A1 | * | 3/2005 | Han | G11C 7/1093 365/189.05 |
| 2006/0129335 A1 | * | 6/2006 | Niijima | G01R 31/31922 702/35 |
| 2018/0374555 A1 | * | 12/2018 | Kwon | G11C 29/38 |
| 2021/0048455 A1 | * | 2/2021 | Xue | G01R 19/165 |
| 2022/0199191 A1 | * | 6/2022 | Nguyen | G11C 29/50 |
| 2023/0061144 A1 | * | 3/2023 | Schaefer | G11C 7/1069 |
| 2023/0097405 A1 | * | 3/2023 | Park | G06F 30/33 716/100 |
| 2023/0197138 A1 | * | 6/2023 | Becker | G11C 11/4074 365/226 |
| 2023/0395181 A1 | * | 12/2023 | Rovelli | G11C 29/022 |
| 2024/0005980 A1 | * | 1/2024 | Waldrop | G11C 11/4093 |

* cited by examiner

*Primary Examiner* — Albert Decady
*Assistant Examiner* — Osman M Alshack
(74) *Attorney, Agent, or Firm* — CKC & Partners Co., LLC

(57) ABSTRACT

A system is provided. The system comprises a memory device and a test device. The test device that is operatively coupled to the memory device and transmits a plurality of glitch signals and a plurality of control signals after the plurality of glitch signals for a write operation of the memory device according to a data signal. The test device determines, based on write data of the data signal, whether read data outputted in a read operation of the memory device are bitwise shifted to generate a test result indicating a disturbance to the write operation induced by the plurality of glitch signals.

16 Claims, 10 Drawing Sheets

SYSTEM AND METHOD FOR TESTING MEMORY DEVICE

BACKGROUND

Field of Invention

The present invention relates to a system and a method for testing a memory device. More particularly, the present invention relates to a rectifier circuit and a receiver circuit with a bias circuit.

Description of Related Art

With the rapidly developed technologies of manufacturing processes of memory devices, memory devices designed are smaller and have circuits with high density. Increasing density of circuits results in benefits in terms of speed and functionality, but errors and fabrication issues are projected to increase. It is usually necessary to test a memory device to confirm the product reliability and the yield.

SUMMARY

In some embodiments, a system is provided. The system comprises a memory device and a test device. The test device that is operatively coupled to the memory device and transmits a plurality of glitch signals and a plurality of control signals after the plurality of glitch signals for a write operation of the memory device according to a data signal. The test device determines, based on write data of the data signal, whether read data outputted in a read operation of the memory device are bitwise shifted to generate a test result indicating a disturbance to the write operation induced by the plurality of glitch signals.

In some embodiments, the test device is operatively coupled to first and second data strobe pins of the memory device which are configured to receive a differential data strobe signal pair. The differential data strobe signal pair comprises the plurality of control signals. The test device is further configured to output a first glitch signal of the plurality of glitch signals to the first data strobe pin and a second glitch signal, inverted from the glitch signal, to the second data strobe pin.

In some embodiments, in the write operation, the memory device is configured to latch data of the data signal in response to at least three edges that are in a first glitch signal of the plurality of glitch signals and in a first control signal of the plurality of control signals.

In some embodiments, the first glitch signal has a first voltage level in a first interval and a second voltage level in a second interval after the first interval.

In some embodiments, when a ratio between the first and second intervals ranges from 0.025 to 0.075, the read data are inconsistent with the write data.

In some embodiments, when a ratio between the first and second intervals ranges from 0.15 to 0.25, the read data are consistent with the write data.

In some embodiments, when the read data are bitwise shifted, compared with the write data, at least one mismatched bit between the read data and the write data has a logic high value.

In some embodiments, a system is provided. The system comprises a memory device and a test device. The memory device comprising an input/output circuit. The test device is operatively coupled to the memory device and outputs a glitch signal to the memory device and outputs a control signal after the glitch signal is output. The input/output circuit latches, in response to the glitch signal and the control signal, data for a write operation of a memory device. The test device compares write data corresponding to the write operation and read data outputted in a read operation of the memory device to determine whether the memory device is disturbed by the glitch signal.

In some embodiments, the test device generates the glitch signal at a first time and generates the control signal at a second time after the first time.

In some embodiments, the input/output circuit latches data from a write data at a third time after the second time.

In some embodiments, the glitch signal has a first voltage level in a first interval and has a second voltage level greater than the first voltage level in a second interval after the first interval. When a ratio between the first and second intervals is greater than 0.125, the read data are consistent with the write data.

In some embodiments, the glitch signal has a different voltage levels in a first interval and in a second interval after the first interval. When a ratio between the first and second intervals is smaller than 0.1, the write data are inconsistent with the read data.

In some embodiments, a method is provided. The method comprises: generating a write data signal to a first pin of a memory device; generating a glitch signal and a control signal to a second pin of the memory device; latching data from the write data signal for a write operation in response to at least one of the glitch signal and the control signal; performing a read operation to generate a read data signal; outputting a test result by comparing the write data signal and the read data signal.

In some embodiments, a duration of the glitch signal is shorter than a clock period of the memory device.

In some embodiments, the glitch signal has a first voltage level in a first interval and has a second voltage in a second interval different from the first interval.

In some embodiments, when the second interval is greater than the first interval, the read data is inconsistent with the write data.

In some embodiments, further comprising displaying, by a display device, the write data signal and the read data signal for a comparison thereof.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
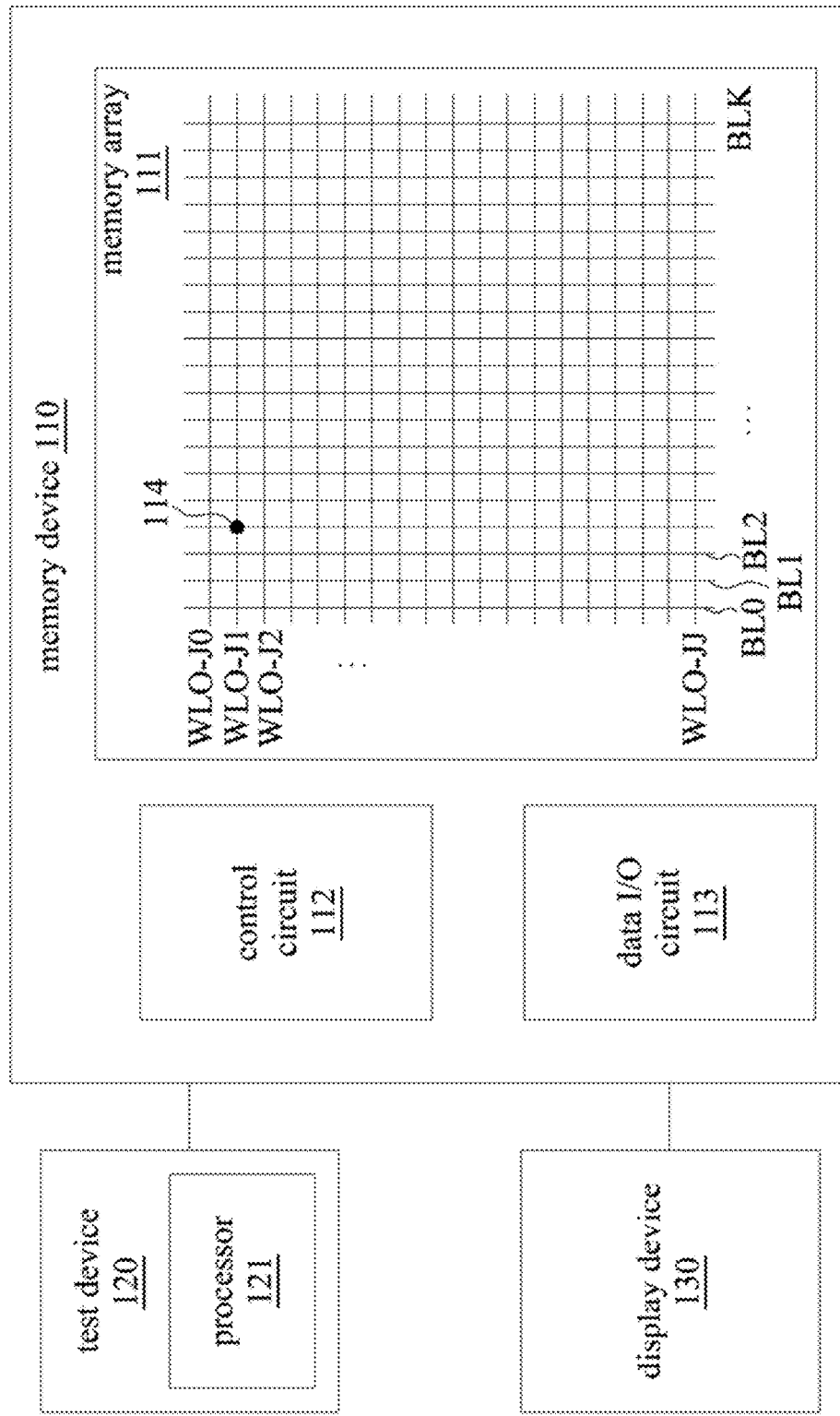
FIG. 1 is schematic diagram of a system in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

As used herein, the terms "comprising," "including," "having," "containing," "involving," and the like are to be understood to be open-ended, i.e., to mean including but not limited to.

Reference throughout the specification to "one embodiment," "an embodiment," or "some embodiments" means that a particular feature, structure, implementation, or characteristic described in connection with the embodiment(s) is included in at least one embodiment of the present disclosure. Thus, uses of the phrases "in one embodiment" or "in an embodiment" or "in some embodiments" in various places throughout the specification are not necessarily all referring to the same embodiment. Furthermore, the particular features, structures, implementation, or characteristics may be combined in any suitable manner in one or more embodiments.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, the term "and/or" includes any and all combinations of one or more of the associated listed items.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

Reference is now made to FIG. 1. FIG. 1 is schematic diagram of a system 100 in accordance with various embodiments of the present disclosure. For illustration, the system includes a memory device 110, a test device 120 and a display device 130. In some embodiments, the memory device 110 is operatively coupled to the test device 120 and the display device 130.

In some embodiments, the test device 120 is a test machine for testing a memory including but not limited to dynamic random-access memory (DRAM) and static random-access memory (SRAM). In some embodiments, the test device 120 is a programmable test machine. In the embodiment shown in FIG. 1, the test device 120 includes a processor 121.

According to various embodiments, the processor 121 includes a central processing unit (CPU), or other programmable general-purpose or special-purpose micro control units (MCU), microprocessors, digital signal processors (DSP), programmable controllers, application-specific integrated circuits (ASIC), graphics processing units (GPU), arithmetic logic units (ALU), complex programmable logic devices (CPLD), field-programmable gate arrays (FPGA), or other similar components or a combination of the above components.

In some embodiments, the display device 130 is a device for displaying information in visual form, including a computer monitor, an oscilloscope and any other suitable devices.

In some embodiments, the memory device 110 is a hardware component that stores data, for example, a DRAM device or a SRAM device. In some embodiments, the memory device 110 is a double data rate fifth-generation synchronous dynamic random-access memory (DDR5 SDRAM) chip. As shown in FIG. 1, according to some embodiments, the memory device 110 includes a memory array 111, a control circuit 112 and a data input/output (I/O) circuit 113. The memory array 111 includes multiple memory cells 114 (storage circuits) arranged in a two or three dimensional array. According to various embodiments, the memory cells 114 include volatile memory cells, non-volatile memory cells, or a combination of them.

In practice, the memory array 111 further includes word lines WL0, WL1 . . . . WLJ and bit lines BL0, BL1 . . . . BLK. In some embodiments, the word lines WL0-WLJ and the bit lines BL0-BLK include conductive metals or conductive rails. For illustration, each one of the memory cells 114 is coupled to a corresponding word line WL (one of the word lines WL0-WLJ) and a corresponding bit line BL (one of the bit lines BL0-BLK). In some embodiments, the memory array 111 includes additional lines (e.g., select lines, reference lines, reference control lines, power rails, etc.)

According to some embodiments of the present disclosure, the control circuit 112 is a hardware component that executes operations to the memory array 111 according to commands (e.g., commands from the test device 120). For example, in some embodiments, the control circuit 112 executes a write operation or a read operation to the memory array 111 according to a command from the test device 120. In some embodiments, the control circuit 112 is configured to write data to or read data from the memory array 111 through the word lines WL0-WLJ and the bit lines BL0-BLK.

In some embodiments, the data I/O circuit 113 is a hardware component that receives data for a write operation or output data retrieved through a read operation. For example, in some embodiments, the data I/O circuit 113 receives data from the test device 120 and the control circuit 112 writes the data to the memory array 111 according to a command from the test device 120. For example, in some embodiments, the control circuit 112 reads data from the memory array 111 according to a command from the test device 120 through the data I/O circuit 113 outputting the data to the test device 120.

The configurations of FIG. 1 are given for illustrative purposes. Various implements are within the contemplated scope of the present disclosure. For example, in some embodiments, the system 100 further includes a processor that is different from the processor 121 and operatively coupled to the memory device 110 and/or the display device 130.

Figure 2:
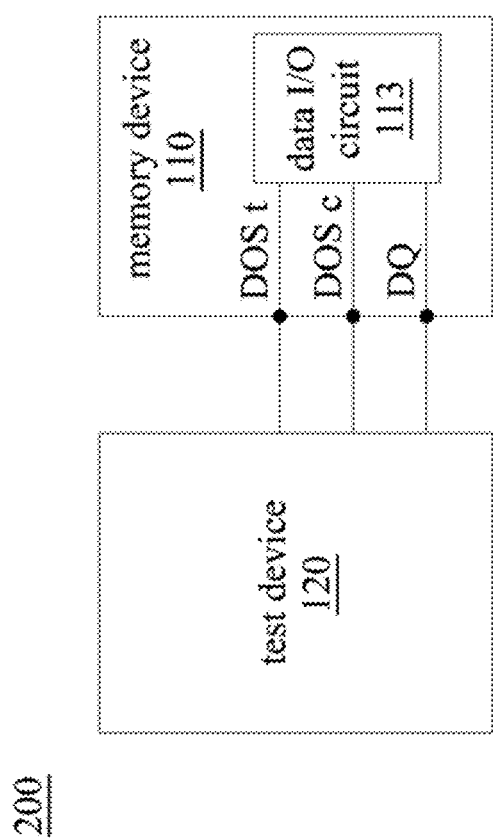
FIG. 2 is a part of the system in FIG. 1 in accordance with various embodiments of the present disclosure.

Reference is now made to FIG. 2. FIG. 2 is a part of system 100 in FIG. 1 in accordance with various embodiments of the present disclosure. With respect to the embodiments of FIG. 1, like elements in FIG. 2 are designated with the same reference numbers for ease of understanding. The specific operations of similar elements, which are already discussed in detail in above paragraphs, are omitted herein for the sake of brevity.

For illustration, the memory device 110 further includes a pin DQ, a pin DQS_t, and a pin DQS. The pin DQ is configured to receive a (write) data signal corresponding to data for a write operation or to output a (read) data signal corresponding to data retrieved through a read operation. For example, in some embodiments, the test device 120 generates the data signal to the pin DQ for a write operation and the memory device 110 outputs a data signal corresponding to a read operation through the pin DQ to the test device 120.

In some embodiments, the pin DQS_t and the pin DQS_c are configured to transmit a differential data strobe (DQS) signal pair. Specifically, in some embodiments, the pin DQS_t is configured to transmit a DQS signal of the DQS signal pair and the pin DQS_c is configured to transmit a complementary DQS signal of the DQS signal pair that is inverted from the DQS signal. For example, in some embodiments, the memory device 110 receives the DQS signal pair from the test device 120 through the pins DQS_t and DQS_c for the write operation and outputs a DQS signal corresponding the read operation to the test device 120 through the pin DQS_t.

As shown in FIG. 2, the data I/O circuit 113 is coupled to the pin DQ, the pin DQS_t and the pin DQS_c in accordance with various embodiments of the present disclosure. In some embodiments, the data I/O circuit 113 is configured to latch data corresponding to the DQ pin (i.e., sampling a data signal received from the DQ pin to get the data) according to the signals (e.g., DQS signal pair) received by the pins DQS_t and DQS_c for a write operation. In some embodiments, the data I/O circuit 113 is further configured to transmit a data signal and a DQS signal pair corresponding to a read operation through the pins DQ, DQS_t and DQS_c. Further detail will be discussed in the following paragraphs.

The configurations of FIG. 2 are given for illustrative purposes. Various implements are within the contemplated scope of the present disclosure. For example, in some embodiments, the pins DQ, DQS_t, and DQS_c are further coupled to the display device 130.

As shown in FIGS. 3A, 3B and 4-9, the test device 120 is configured to determine whether the memory device 110 under the examination is vulnerable to undesired noise by generate glitch signals, for example, glitch signals g_t, g_c, to disturb a write operation of the memory device 110 according to some embodiments. The configurations are detailed in the following paragraphs.

Figure 3B:
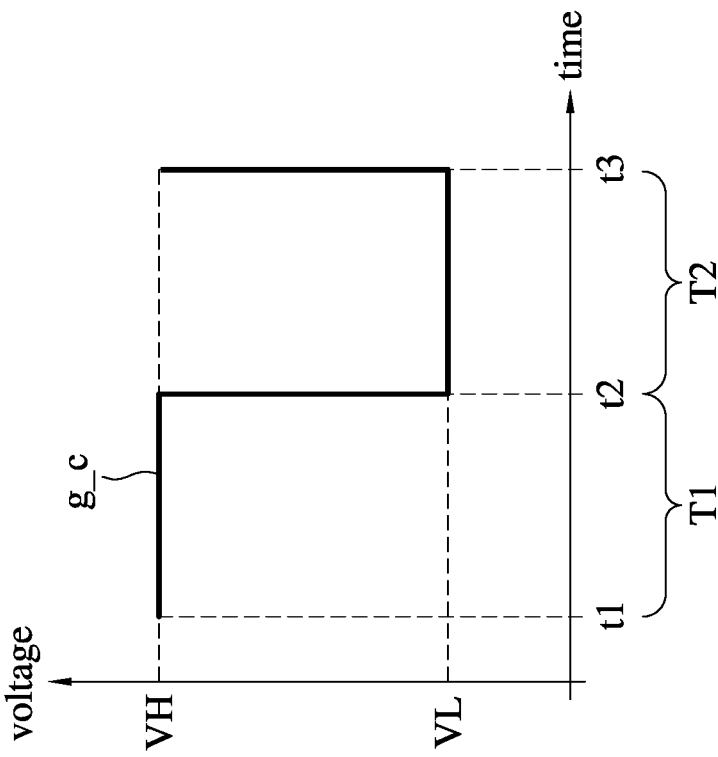
FIG. 3B is a schematic diagram of example waveforms of a glitch signal in accordance with various embodiments of the present disclosure.
Figure 3A:
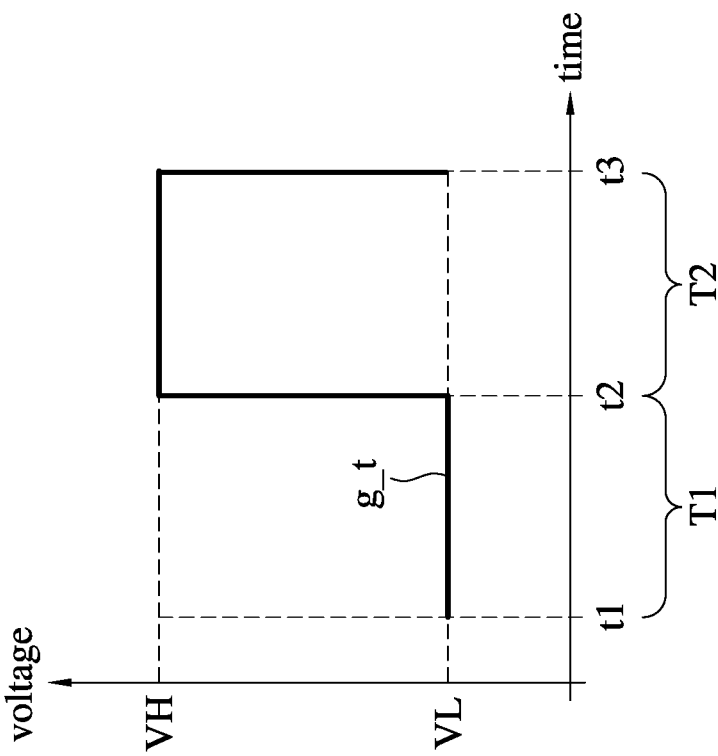
FIG. 3A is a schematic diagram of example waveforms of a glitch signal in accordance with various embodiments of the present disclosure.

Reference is now made to FIG. 3A and FIG. 3B. FIG. 3A and FIG. 3B are schematic diagram of example waveforms of the glitch signal g_t and the glitch signal g_c respectively in accordance with various embodiments of the present disclosure. With respect to the embodiments of FIGS. 1-2, like elements in FIG. 3A and FIG. 3B are designated with the same reference numbers for ease of understanding.

In some embodiments, the test device 120 is configured to generate a glitch (noise) signal for disturbing the memory device 110. For example, in some embodiments, the test device 120 generates a glitch signal to the memory device 110 to hinder the memory device 110 executing a write operation correctly. In some embodiments, the test device 120 generates a glitch signal g_t to the pin DQS_t and generates a glitch signal g_c to the pin DQS_c for disturbing the memory device 110.

As shown in FIG. 3A, in some embodiments, the test device 120 generates the glitch signal g_t that has a voltage level VL in an interval T1 (from a time t1 to a time t2) and has a voltage level VH in an interval T2 (from the time t2 to a time t3) after the interval T1 to the pin DQS_t. Time delay in the rising and the falling of voltage level is neglected in the present disclosure. Similarly, as shown in FIG. 3B, the test device 120 generates the glitch signal g_c that has the voltage level VH in the interval T1 and has the voltage level VL in the interval T2 to the pin DQS_c. In some embodiments, the voltage level VH is greater than the voltage level VL. In some embodiments, the glitch signals g_t and g_c are inverted to each other.

The configurations of FIG. 3A and FIG. 3B are given for illustrative purposes. Various implements are within the contemplated scope of the present disclosure. For example, in some embodiments, the voltage level VL is zero volts or smaller than zero volts.

Figure 4:
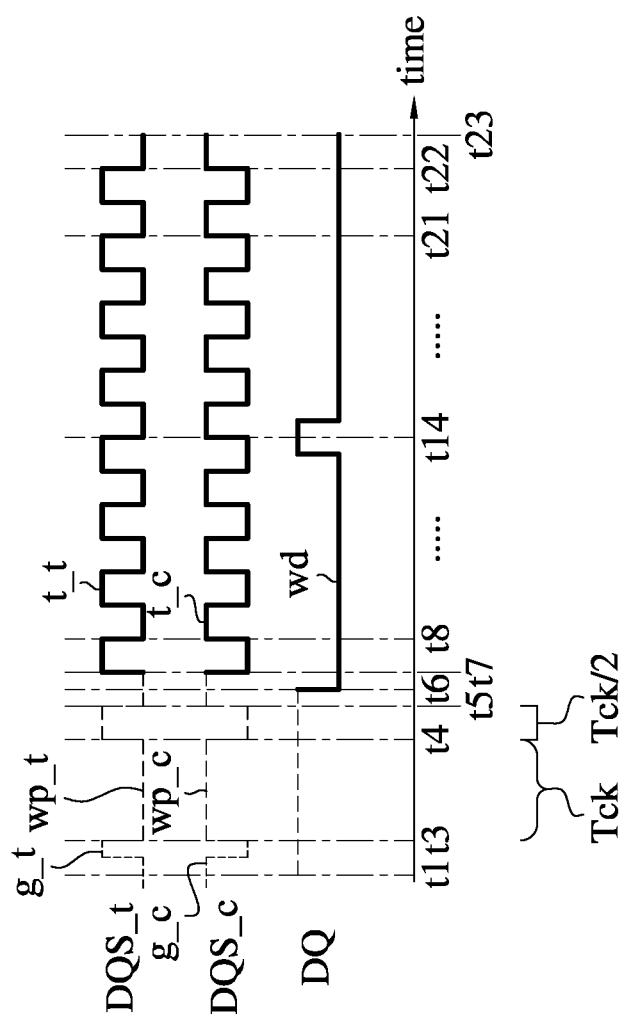
FIG. 4 is a schematic diagram of example waveforms of signals at pins in accordance with various embodiments of the present disclosure.

Reference is now made to FIG. 4. FIG. 4 is a schematic diagram of example waveforms of signals at the pins DQ, DQS_t and DQS_c in accordance with various embodiments of the present disclosure. With respect to the embodiments of FIGS. 1-2, 3A and 3B, like elements in FIG. 4 are designated with the same reference numbers for ease of understanding.

For illustration, in some embodiments, the test device 120 generates the glitch signals g_t and g_c, having a duration between the time t1 and the time t3, to the pins DQS_t and DQS_c respectively. At the time t3, the test device 120 generates a DQS signal and a complementary DQS signal forming a differential DQS signal pair to the pins DQS_t and DQS_c respectively for a write operation. In some embodiments, the DQS signal and the complementary DQS signal of the differential DQS signal pair are inverted to each other. In some embodiments, at a time t6 after the time t3, the test device 120 generates a data signal wd corresponding to the write operation to the pin DQ. In some embodiments, the pin DQ has a default voltage level (e.g., the voltage level VH) before the pin DQ receiving the data signal wd (before the time t6).

As shown in FIG. 4, in some embodiments, the DQS signal generated to the pin DQS_t as described in the previous paragraph includes two portions (signals): a write preamble signal wp_t and a toggle signal t_t. In some embodiments, the test device 120 generates the write preamble signal wp_t having a duration of the time t3 to the time t7 and generates the toggle signal t_t having a duration between the time t7 and the time t23.

Similarly, in some embodiments, the complementary DQS signal generated to the pin DQS_c includes two portions (signals): a write preamble signal wp_c and a toggle signal t_c. In some embodiments, the test device 120 generates the write preamble signal wp_c having a duration between the time t3 and the time t7 and generates the toggle signal t_c having a duration between the time t7 and the time t23. In some embodiments, the write preamble signals wp_t, wp_c are referred to as control signals.

For the sake of brevity, in the following paragraphs, one of the write preamble signals wp_t, wp_c and one of the toggle signals t_t, t_c will be discussed in details as the write preamble signals wp_t, wp_c are complementary with each other and the toggle signals t_t, t_c are complementary with each other.

In some embodiments, the write preamble signal wp_t has the voltage level VL from the time t3 to a time t4 between which is an interval Tck equal to a clock period of the memory device 110. The preamble signal wp_t further has the voltage value VH from the time t4 to the time t5 and has the voltage level VL from the time t5 to the time t7. An interval between the time t4 and the time t5 and an interval between the time t5 and the time t7 are equal to half the interval Tck (an interval Tck/2). In some embodiments, the write preamble signal wp_t is inverted to the write preamble signal wp_c.

In some embodiments, the toggle signal t_t alternately has the voltage level VL and the voltage level VH in every interval Tck/2. Tck/2 referrers to as an interval between adjacent times in the times t7 to t23. Specifically, as shown in FIG. 4, the toggle signal t_t has the voltage level VH from the time t7 to the time t8 and has the voltage level VL from the time t8 to the time t9.

For the write operation of the memory device 110, the data I/O circuit 113 latches data from the pin DQ in response to edges (e.g., sensing three edges) of signals at the pin DQS_t.

In various embodiments, as latency exist in rising and falling in the DQS signals, the data I/O circuit 113 is triggered to latch data from the pin DQ in response to crosses of signals at the pins DQS_t and DQS_c (i.e., when the signals are consistent with each other). For example, in some embodiments, the data I/O circuit 113 starts to latch data from the pin DQ in response to sensing three crosses.

In some embodiments, when there are no glitch signals g_t and g_c before the differential DQS signal pair during the write operation or the memory device 110 under the examination is not disturbed by the glitch signals g_t and g_c, the data I/O circuit 113 is triggered to latch data from the pin DQ at the time t7 in response to the write preamble signals wp_t, wp_c (when the write preamble signal wp_t ends) and the control circuit 112 writes the latched data to the memory array 111.

In addition, in some embodiments, the data I/O circuit 113 latches write data in response to edges of the toggle signals t_t, t_c (or when the toggle signals t_t and t_c cross each other.) For example, in the embodiment depicted in FIG. 4, the data I/O circuit 113 latches 16 bits data in sequence corresponding to the voltage level of the data signal wd during the times t7-t22 in response to falling edges of the toggle signal t_t (or the toggle signal t_t crossing/being equal to the toggle signal t_c). For example, as shown in FIG. 4, the data I/O circuit 113 latches a bit of data "1" at the time t4 when the toggle signals t_t and t_c cross each other. In the embodiment depicted in FIG. 4, the latched 16 bits data in sequence are "0000000100000000". In some embodiments, the control circuit 112 writes each bit of the 16 bits data to a corresponding memory cell 114 according to a memory address output by the test device 120 for the write operation.

In some embodiments, when the memory device 110 is disturbed by the glitch signal g_t and/or the glitch signal g_c in performing the write operation, the data I/O circuit 113 starts to latch data from the pin DQ before the time t7 (i.e., before the write preamble signal wp_t ends). Specifically, for example, in the embodiment depicted in FIG. 4, the data I/O circuit 113 starts to latch data in response to the glitch signal g_t and the write preamble signal wp_t at the time t4. The data I/O circuit 113 latches 16 bits data in sequence corresponding to the voltage level of the pin DQ at the times t4, t5, t7-t20 in response to edges of the write preamble signal wp_t and the toggle signal t_t (or crosses of the write preamble signals wp_t and wp_c and crosses of the toggle signals t_t and t_c).

It should be noted that the voltage level at the pin DQ from the time t1 to the time t6 is a default voltage level (i.e., the voltage level when there is no data transmitted through the pin DQ). In various embodiments, the default voltage level is either the voltage level VH or the voltage level VL. In the embodiment depicted in FIG. 4, the default voltage level is the voltage level VH. Accordingly, in the embodiments of the memory device 110 being disturbed by the glitch signal g_t and/or the glitch signal g_c, the latched 16 bits data in sequence are "1100000001000000".

The configurations of FIG. 4 are given for illustrative purposes. Various implements are within the contemplated scope of the present disclosure. For example, in some embodiments, each voltage levels of the data signal wd at the times t7-t22 can be arbitrarily one of the voltage levels VL and VH. In other word, the data from the test device 120 for the write operation can be arbitrary. For example, in some embodiments, for a data signal wd corresponding to data "0000000010000000", only the voltage level at the time t15 is the voltage level VH among the voltage levels of the data signal wd at the times t7-t22.

Figure 5:
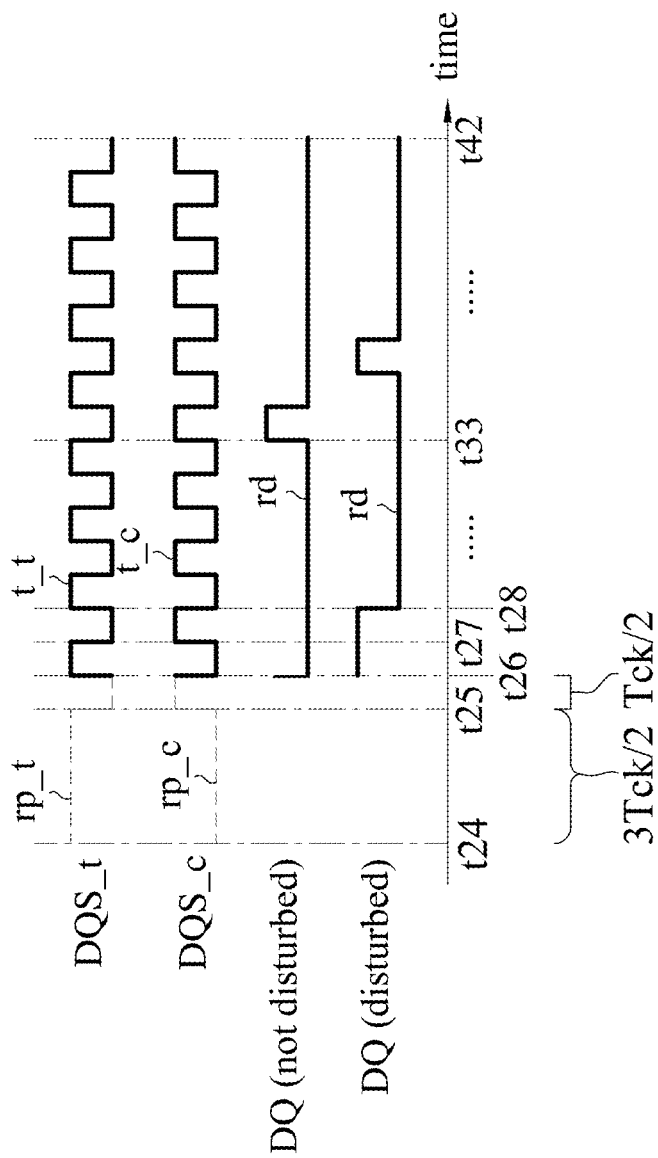
FIG. 5 is a schematic diagram of example waveforms of signals at pins in accordance with various embodiments of the present disclosure.

Reference is now made to FIG. 5. FIG. 5 is a schematic diagram of example waveforms of signals at the pins DQ, DQS_t and DQS_c in accordance with various embodiments of the present disclosure. With respect to the embodiments of FIGS. 1-2, 3A, 3B and 4, like elements in FIG. 5 are designated with the same reference numbers for ease of understanding.

For illustration, in some embodiments of the read operation, the test device 120 outputs a command for the read operation to the memory device 110. In some embodiments, the write operation and the read operation correspond to a same memory address. At a time t24, the data I/O circuit 113 generates a DQS signal and a complementary DQS signal forming another differential DQS signal pair to the pins DQS_t and DQS_c respectively. In some embodiments, at a time t26 after the time t24, the data I/O circuit 113 outputs a data signal rd corresponding to data retrieved through the read operation to the test device 120 through the pin DQ.

As shown in FIG. 5, in some embodiments, the DQS signal generated to the pin DQS_t corresponding the read operation as described in the previous paragraph includes two portions (signals): a read preamble signal rp_t and a toggle signal t_t. In some embodiments, the memory device 110 generates the read preamble signal rp_t having a duration between the time t24 and the time t26 and generates the toggle signal t_t having a duration between the time t26 and a time t42.

In some embodiments, the read preamble signal rp_t has the voltage level VH in a duration of the time t24 to a time t25 between which are three halves intervals Tck (an interval 3Tck/2). The preamble signal rp_t further has the voltage value VL in a duration of the time t25 to the time t26. An interval between the time t25 and the time t26 is the interval Tck/2. In some embodiments, the read preamble signal rp_t is inverted to the read preamble signal rp_c.

In some embodiments, the toggle signal t_t starting from the time t28 alternately has the voltage level VL and the voltage level VH every interval Tck/2. For example, as shown in FIG. 5, the toggle signal t_t has the voltage level VH from the time t26 to the time t27 and has the voltage level VL from the time t27 to the time t28. It should be noted that an interval between adjacent times of the times t26 to t42 is the interval Tck/2.

In some embodiments, the data I/O circuit 113 starts to output the data signal rd corresponding to data stored in the memory cells 114 corresponding to the memory address of the read operation at the time t26 when the read preamble signal rp_t ends.

In addition, in some embodiments, when the memory device 110 is not disturbed by the glitch signal g_t and/or the glitch signal g_c and performs the write operation correctly, data corresponding the data of the data signal rd is consistent with the data of the write data signal wd. For example, in the embodiment depicted in FIG. 5, the data I/O circuit 113 generates the data signal rd (the data signal rd annotated with "not disturbed") corresponding to 16 bits of data in sequence "0000000100000000" which are consistent with the 16 bits of data corresponding to the write signal wd. It should be noted that a voltage level of the data signal rd between an interval corresponding to adjacent edges of the toggle signal t_t (e.g., the interval between the time t26 and the time t27) corresponds to a bit of the data.

In some embodiments, when the memory device 110 is disturbed by the glitch signal g_t and/or the glitch signal g_c and fails to perform the write operation correctly, read data corresponding to the data signal rd is not consistent with write data corresponding to the write operation (i.e., the data corresponding to the write signal wd). For example, in the embodiment depicted in FIG. 5, the data I/O circuit 113 generates the data signal rd (the data signal rd annotated with "disturbed") corresponding to 16 bits of read data in sequence "1100000001000000" which are not consistent with the 16 bits of write data "0000000100000000" corresponding to the write signal wd. Alternatively stated, data corresponding to the data signal rd are bitwise shifted base on the data corresponding to the write operation.

In some embodiments, when the read data are bitwise shifted, compared with the write data, at least one mismatched bit between the read data and the write data has a logic high value. For example, the read data "1100000001000000" corresponding to the data signal rd annotated with "disturbed" are the 16 bits of write data "0000000100000000" being bitwise shifted to the right by two bits with two "1" shifted in to replace discarded bits. According to various embodiments, the logic values ("1" or "0") to be shifted in to replace the discarded bits are associated with the default voltage level at the pin DQ. The number of bits to be shifted is associated with the number of the time interval Tck by which the operation of latching write data is brought forward when the write operation is disturbed.

The configurations of FIG. 5 are given for illustrative purposes. Various implements are within the contemplated scope of the present disclosure. For example, in some embodiments, the voltage level of the data signal rd (annotated with "disturbed") from the time t26 to the time t28 is the voltage level VL, when the voltage level VL is the default voltage level.

In some embodiments, the test device 120 performs a test to the memory device 110. The test device 120 compares the data signal wd and the data signal rd to generate a test result. When the data signal wd and the data signal rd are determined to be consistent with each other, the test device 120 outputs the test result indicating that the memory device 110 passes the test. On the contrary, when the data signal wd and the data signal rd are determined to be inconsistent with each other, the test device 120 outputs the test result indicating that the memory device 110 fails the test (i.e., disturbed by the glitch signal g_t and/or the glitch signal g_c).

Specifically, when the test device 120 determines the data corresponding to the read signal rd are bitwise shifted based on the data corresponding to the write signal wd, the test device 120 outputs the test result indicating that the memory device 110 fails the test (i.e., disturbed by the glitch signal g_t and/or the glitch signal g_c). In some embodiments, when the test device 120 determines that based on the write data, the read data are bitwise shifted with at least one logic high value ("1") shifted in to replace at least one discarded bits, the test device 120 outputs the test result indicating that the memory device 110 fails the test.

Referring FIGS. 3A, 3B, 4 and 5, according to various embodiments, the intervals T1 and T2 have different length. The following table describes different configurations of the intervals T1 and T2 and example test results of a plurality of memory devices 110 corresponding to the configurations.

| T1/T2 | D1 | D2 | D3 | D4 | D5 | D6 | D7 | D8 | D9 | D10 |
|---|---|---|---|---|---|---|---|---|---|---|
| No Glitch | P | P | P | P | P | P | P | P | P | P |
| 0.01Tck/0.4Tck | F | F | F | F | F | F | F | F | F | F |
| 0.02Tck/0.4Tck | F | F | F | F | F | F | F | F | F | F |
| 0.03Tck/0.4Tck | F | F | F | F | F | F | F | F | F | F |
| 0.04Tck/0.4Tck | F | P | F | F | F | F | F | F | F | P |
| 0.05Tck/0.4Tck | P | P | P | P | P | F | P | F | P | P |
| 0.06Tck/0.4Tck | P | P | P | P | P | P | P | P | P | P |
| 0.07Tck/0.4Tck | P | P | P | P | P | P | P | P | P | P |
| 0.08Tck/0.4Tck | P | P | P | P | P | P | P | P | P | P |
| 0.09Tck/0.4Tck | P | P | P | P | P | P | P | P | P | P |
| 0.10Tck/0.4Tck | P | P | P | P | P | P | P | P | P | P |

For illustration, the first column of the table corresponds to length of the interval T1 and the interval T2. For example, "0.01Tck/04Tck" indicates that the interval T1 is configured to be 0.01 times the interval Tck and the interval T2 is configured to be 0.4 times the interval Tck. The second column to the eleventh column correspond to ten memory devices 110 (annotated as D1-D10) and test results corresponding to different configurations of the intervals T1 and T2, in which "F" stands for that the memory device 110 fail the test and "P" stands for that the memory device 110 pass the test.

Referring to the table, in some embodiments, when a ratio between the interval T1 and the interval T2 is greater than 0.125, the memory device 110 passes the test. In some embodiments, when a ratio between the interval T1 and the interval T2 is smaller than 0.1, the memory device 110 fails the test. In some embodiments, when a ratio between the interval T1 and the interval T2 ranges from 0.15 to 0.25, the memory device 110 passes the test. In some embodiments, when a ratio between the interval T1 and the interval T2 ranges from 0.025 to 0.075, the memory device 110 fails the test.

Figure 6:
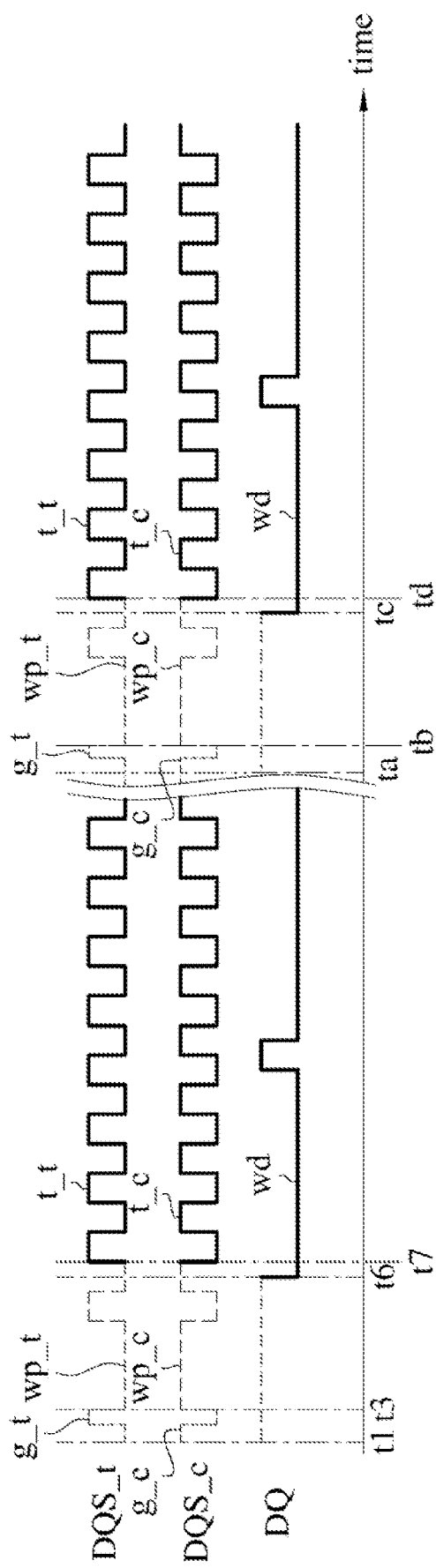
FIG. 6 is a schematic diagram of example waveforms of signals at pins in accordance with various embodiments of the present disclosure.
Figure 7:
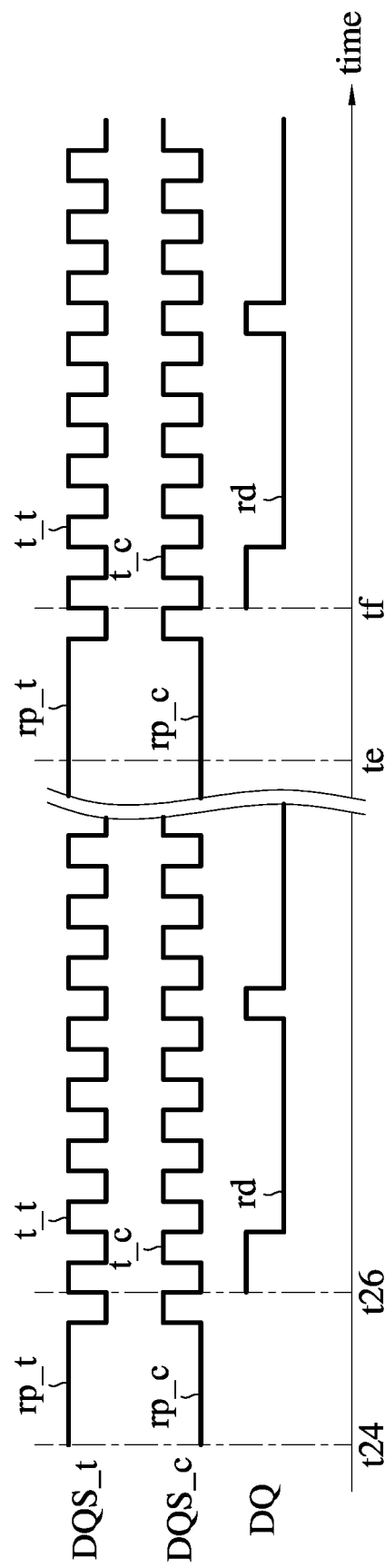
FIG. 7 is a schematic diagram of example waveforms of signals at pins in accordance with various embodiments of the present disclosure.

Reference is now made to FIGS. 6 and 7. FIGS. 6 and 7 are schematic diagrams of example waveforms of signals at the pins DQ, DQS_t and DQS_c in accordance with various embodiments of the present disclosure. With respect to the embodiments of FIGS. 1-2, 3A, 3B, 4 and 5, like elements in FIGS. 6 and 7 are designated with the same reference numbers for ease of understanding.

In some embodiments, the test device 120 generates a plurality of write commands for the memory device 110 to execute a plurality of write operations and generates a plurality of read commands after the plurality of write operations for the memory device 110 to execute a plurality of read operations. In some embodiments, the test device 120 generates differential DQS signal pairs and data signals corresponding to the plurality of write operations and generates corresponding glitch signals before each of the differential DQS signal pairs. In some embodiments, each one of the plurality of write operations and a corresponding read operation corresponds to a same memory address. In some embodiments memory addresses corresponding to the plurality of write operations are different to each other.

For illustration, as shown in FIG. 6, the test device 120 generates a DQS signal including a write preamble signal wp_t having a duration between the time t3 and the time t7 and a toggle signal t_t having a duration between the time t7 to the pin DQS_t for a first write operation. Similarly, the test device 120 generates a complementary DQS signal including a write preamble signal wp_c having a duration between the time t3 and the time t7 and a toggle signal t_c starts from the time t7 to the pin DQS_c for the first write operation. The test device 120 generates a data signal wd corresponding to the first write operation to the pin DQ at the time t6. The test device 120 generates glitch signals g_t and g_c having a duration between the time t1 and the time t3 to the pins DQS_t and DQS_c for disturbing the memory device 110 to perform the first write operation.

In addition, as shown in FIG. 6, the test device 120 generates a DQS signal including a write preamble signal wp_t having a duration between the time tb and the time td and a toggle signal t_t starts from the time td to the pin DQS_t for a second write operation. Similarly, the test device 120 generates a complementary DQS signal including a write preamble signal wp_c having a duration between the time tb and the time td and a toggle signal t_c starts from the time td to the pin DQS_c for the second write operation. The test device 120 generates a data signal wd corresponding to the second write operation to the pin DQ at the time t6. The test device 120 generates glitch signals g_t and g_c having a duration between the time ta and the time tb to the pins DQS_t and DQS_c for disturbing the memory device 110 to perform the second write operation.

In some embodiments, as shown in FIG. 7, the data I/O circuit 113 generates a DQS signal including a read preamble signal rp_t that having a duration between the time t24 and the time t26 and a toggle signal t_t starts from the time t26 to the pin DQS_t corresponding to a first read operation. The first read operation and the first write operation correspond to a same memory address. Similarly, the data I/O circuit 113 generates a complementary DQS signal including a read preamble signal rp_c having a duration between the time t24 and the time t26 and a toggle signal t_c starts from the time t26 to the pin DQS_c corresponding to the first read operation. The data I/O circuit 113 generates a data signal rd corresponding to the first read operation to the pin DQ at the time t6.

In addition, as shown in FIG. 7, the data I/O circuit 113 generates a DQS signal including a read preamble signal rp_t that has a duration between the time the and the time tf and a toggle signal t_t starts from the time tf to the pin DQS_t corresponding to a second read operation. The second read operation and the second write operation correspond to a same memory address. Similarly, the data I/O circuit 113 generates a complementary DQS signal including a read preamble signal rp_c that has a duration between the time te and the time tf and a toggle signal t_c starts from the time tf to the pin DQS_c corresponding to the second read operation. The data I/O circuit 113 generates a data signal rd corresponding to the second read operation to the pin DQ at the time tf.

In some embodiments, the test device 120 performs a test to the memory device 110. The test device 120 compares data signals wd corresponding to the plurality of write operations (including the first and second write operations) and the data signals rd corresponding to the plurality of read operations (including the first and second read operations) to generate a test result.

In some embodiments, when at least one of the data signals wd and a corresponding one of the data signal rd are determined to be inconsistent with each other, the test device 120 outputs the test result indicating that the memory device 110 fails the test. For example, When the data signal wd of the first write operation and the data signal rd of the first read operation are determined to be inconsistent with each other, the test device 120 outputs the test result indicating that the memory device 110 fails the test.

In some embodiments, the display device 130 displays differential DQS signal pairs, data signals wd corresponding to the plurality of write operations and differential DQS signal pairs, data signals rd corresponding to the plurality of read operations (e.g., waveforms shown in FIGS. 6 and 7) for a comparison.

The configurations of FIGS. 6 and 7 are given for illustrative purposes. Various implements are within the contemplated scope of the present disclosure. For example, in some embodiments, arbitrary one of the data signals rd in FIG. 7 can be consistent with the data signals wd in FIG. 6.

Figure 8:
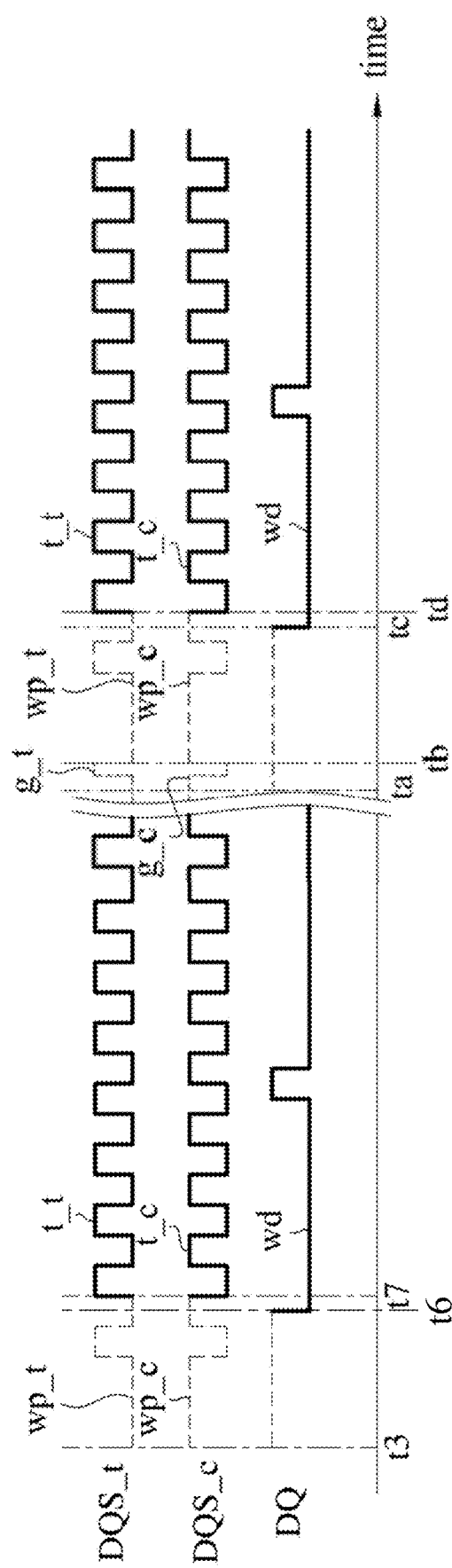
FIG. 8 is a schematic diagram of example waveforms of signals at pins in accordance with various embodiments of the present disclosure.
Figure 9:
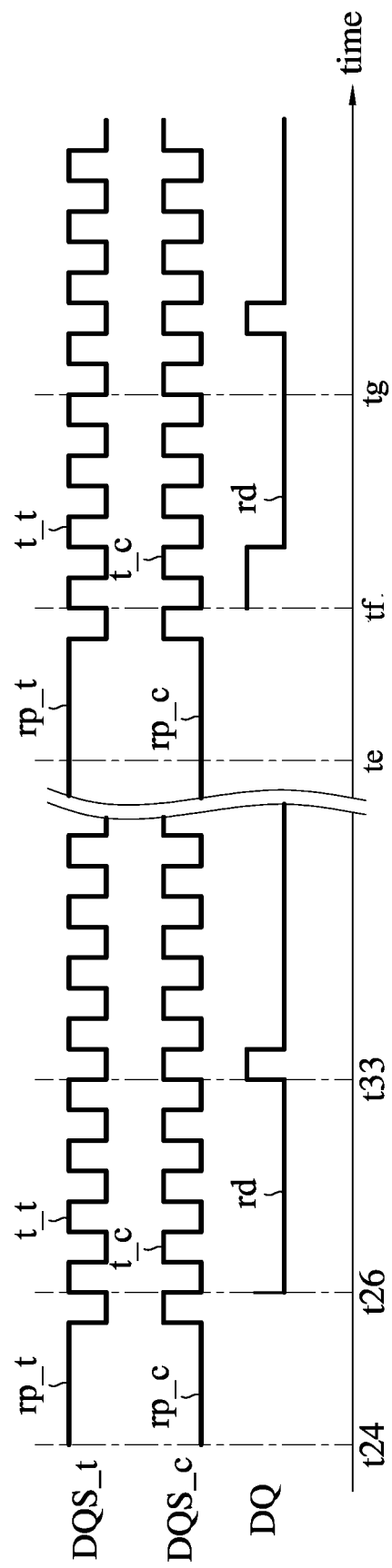
FIG. 9 is a schematic diagram of example waveforms of signals at pins in accordance with various embodiments of the present disclosure.

Reference is now made to FIGS. 8 and 9. FIGS. 8 and 9 are schematic diagrams of example waveforms of signals at the pins DQ, DQS_t and DQS_c in accordance with various embodiments of the present disclosure. With respect to the embodiments of FIGS. 1-2, 3A, 3B, 4-7, like elements in FIGS. 8 and 9 are designated with the same reference numbers for ease of understanding. The specific operations of similar elements, which are already discussed in detail in above paragraphs, are omitted herein for the sake of brevity.

In some embodiments, the test device 120 generates a plurality of write commands for the memory device 110 to execute a plurality of write operations and generates a plurality of read commands after the plurality of write operations for the memory device 110 to execute a plurality of read operations. In some embodiments, the test device 120 generates differential DQS signal pairs and data signals corresponding to the plurality of write operations. In some embodiments, the test device 120 generates glitch signals before each of the differential DQS signal pairs except the differential DQS signal pair corresponding to a first write operation.

For illustration, as shown in FIG. 8, the test device 120 generates a DQS signal including a write preamble signal wp_t that has a duration between the time t3 and the time t7 and a toggle signal t_t starts from the time t7 to the pin DQS_t for a first write operation. Similarly, the test device 120 generates a complementary DQS signal including a write preamble signal wp_c that has a duration between the time t3 and the time t7 and a toggle signal t_c starts from the time t7 to the pin DQS_c for the first write operation. The test device 120 generates a data signal wd corresponding to the first write operation to the pin DQ at the time t6.

In addition, as shown in FIG. 8, the test device 120 generates a DQS signal including a write preamble signal wp_t that has a duration between the time tb and the time td and a toggle signal t_t starts from the time td to the pin DQS_t for a second write operation. Similarly, the test device 120 generates a complementary DQS signal including a write preamble signal wp_c that has a duration between the time tb and the time td and a toggle signal t_c starts from the time td to the pin DQS_c for the second write operation. The test device 120 generates a data signal wd corresponding to the second write operation to the pin DQ at the time t6. The test device 120 generates glitch signals g_t and g_c which having a duration between the time ta and the time tb to the pins DQS_t and DQS_c for disturbing the memory device 110 to perform the second write operation.

In some embodiments, as shown in FIG. 9, the data I/O circuit 113 generates a DQS signal including a read preamble signal rp_t that has a duration between t24 and the time t26 and a toggle signal t_t starts from the time t26 to the pin DQS_t corresponding to a first read operation. The first read operation and the first write operation correspond to a same memory address. Similarly, the data I/O circuit 113 generates a complementary DQS signal including a read preamble signal rp_c that has a duration between the time t24 and the time t26 and a toggle signal t_c starts from the time t26 to the pin DQS_c corresponding to the first read operation. The data I/O circuit 113 generates a data signal rd corresponding to the first read operation to the pin DQ at the time t6.

In addition, as shown in FIG. 9, the data I/O circuit 113 generates a DQS signal including a read preamble signal rp_t that has a duration between the time te and the time tf and a toggle signal t_t starts from the time tf to the pin DQS_t corresponding to a second read operation. The second read operation and the second write operation correspond to a same memory address. Similarly, the data I/O circuit 113 generates a complementary DQS signal including a read preamble signal rp_c that has a duration between the time te and the time tf and a toggle signal t_c starts from the time tf to the pin DQS_c corresponding to the second read operation. The data I/O circuit 113 generates a data signal rd corresponding to the second read operation to the pin DQ at the time tf.

In some embodiments, the display device 130 displays differential DQS signal pairs, data signals wd corresponding to the plurality of write operations and differential DQS signal pairs, data signals rd corresponding to the plurality of read operations (e.g., waveforms shown in FIGS. 8 and 9) for a comparing results of a normal write operation (without a glitch signal) and an abnormal write operation (with a glitch signal).

The configurations of FIGS. 8 and 9 are given for illustrative purposes. Various implements are within the contemplated scope of the present disclosure. For example, in some embodiments, the data signal rd at the time tf in FIG. 9 can be consistent with the data signal rd at the time t26.

Figure 10:
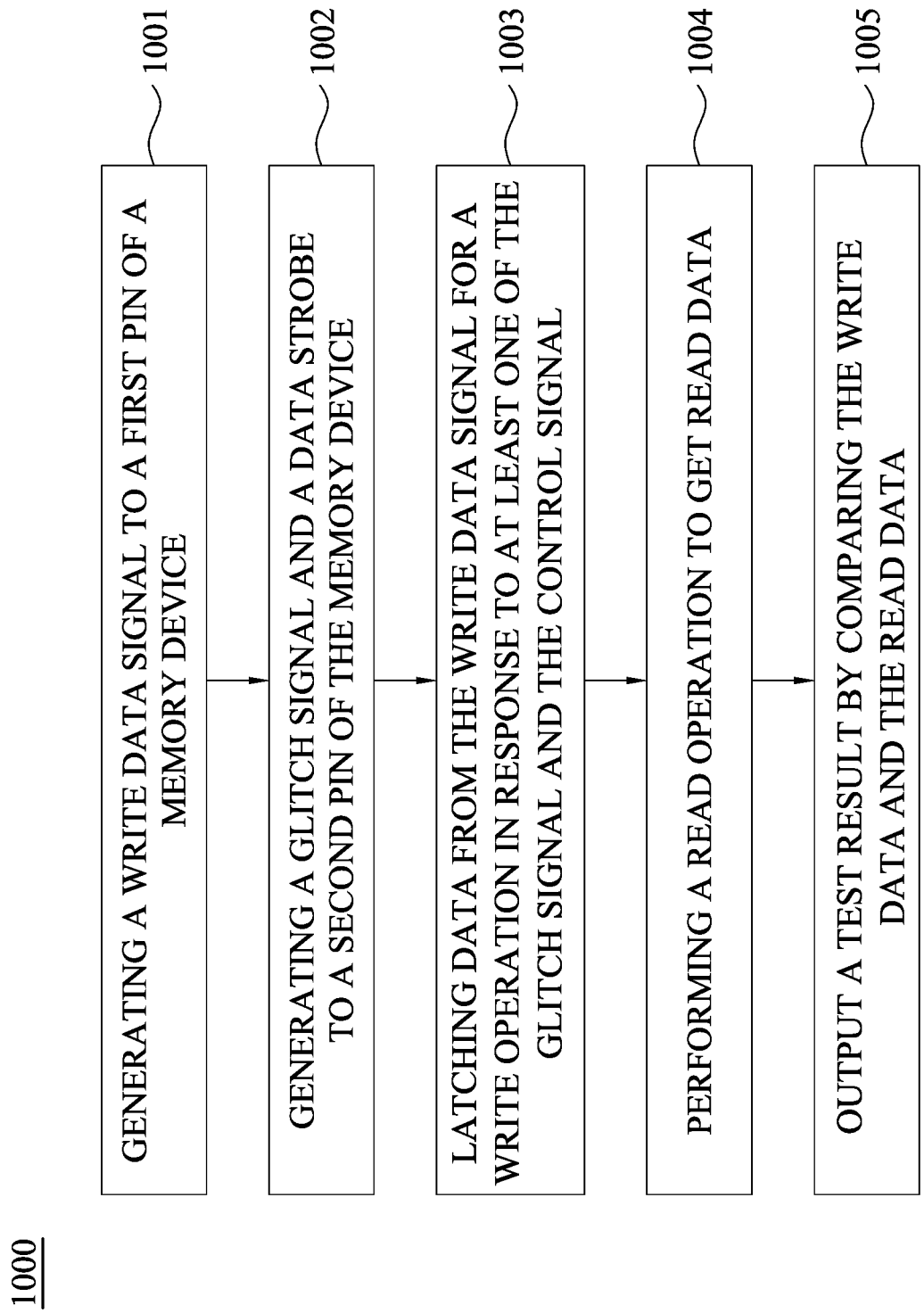
FIG. 10 is an example flow chart of a method in accordance with various embodiments of the present disclosure.

Reference is now made to FIG. 10. FIG. 10 is an example flow chart of a method 1000 corresponding to the system 100 in accordance with various embodiments of the present disclosure. It is understood that additional operations/processes can be provided before, during, and after the operations/processes shown by FIG. 10, and some of the operations/processes described below can be replaced or eliminated, for additional embodiments of the method 1000. The order of the operations/processes may be interchangeable. Throughout the various views and illustrative embodiments, like reference numbers are used to designate like elements. The method 1000 includes operations 1001-1005 that are described below with reference to FIGS. 1, 2, 3A, 3B and 4-9.

In operation 1001, the test device 120 generates a write data signal (e.g., data signal wd) to a first pin (e.g., pin DQ) of the memory device 110. The write data signal corresponds to write data of a write operation.

In operation 1002, the test device 120 generates a glitch signal (e.g., glitch signal g_t) and a control signal (e.g., write preamble signal wp_t) to a second pin (e.g., pin DQS_t) of the memory device 110.

In operation 1003, the data I/O circuit 113 latches data from the write data signal for the write operation in response to at least one of the glitch signal and the control signal. For example, as shown in FIG. 4, in some embodiments, the data I/O circuit 113 latches data from the write data signal wd in response to the write preamble signal wp_t (control signal). In some embodiments, the control circuit 112 writes the data to the memory array 111 according to a memory address corresponding to the write operation.

In operation 1004, the memory device 110 performs a read operation to generate a read data signal (e.g., data signal rd). In some embodiments, the test device output a read command for the memory device 110 to execute a read operation according to the memory address corresponding to the write operation. The data I/O circuit 113 retrieves read data according to the memory address and generates the read data signal corresponding to the read data.

In operation 1005, a processor (e.g., the processor 121 of the test device 120) outputs a test result by comparing the write data signal (the write data) and the read data signal (the read data). In some embodiments when the write data signal (the write data) is consistent with the read data signal (the read data), the test device 120 outputs a test result indicating that the memory device 110 passes a test (not disturbed by the glitch signal). On the contrary, when the write data signal (the write data) is inconsistent with the read data signal (the read data), the processor (e.g., the processor 121 of the test device 120) outputs a test result indicating that the memory device 110 fails the test (disturbed by the glitch signal).

In some embodiments when the read data are bitwise shifted based on the write data, the test device 120 outputs a test result indicating that the memory device 110 fails the test (disturbed by the glitch signal).

In some embodiments, a duration of the glitch signal is shorter than a clock period (the interval Tck) of the memory device 110. For example, in some embodiments, the interval of the glitch signal equals to 0.41 times the clock period (the interval Tck) of the memory device 110.

In some embodiments, the glitch signal g_t has the voltage level VL for the interval T1 and has the voltage level VH in the interval T2 different from the interval T1. In some embodiments, the glitch signal g_c has the voltage level VH for the interval T1 and has the voltage level VL in the interval T2.

In some embodiments, when the interval T2 is greater than the interval T1, the write data is inconsistent with the read data. For example, in some embodiments, when the interval T2 is 0.4 times the interval Tck and the interval T1 is 0.01 times the interval Tck, the read data is inconsistent with the write data.

In some embodiments, the display device 130 displays the write data signal (the data signal wd) and the read data signal (the data signal rd) for a comparison thereof.

As described above, the system and the method provided in the present disclosure help test whether a memory device is disturbed by a glitch signal (noise) during a write operation to evaluate the reliability of the memory device. Through generating a glitch signal by a test device to the memory device during a write operation and inspecting data retrieved by a read operation, defective memory device can be detected.

While the disclosure has been described by way of example(s) and in terms of the preferred embodiment(s), it is to be understood that the disclosure is not limited thereto. Those skilled in the art may make various changes, substitutions, and alterations herein without departing from the spirit and scope of the present disclosure. In view of the foregoing, it is intended that the present invention cover modifications and variations of this invention provided they fall within the scope of the following claims.

What is claimed is:

1. A system, comprising:
a memory device; and
a test device that is operatively coupled to the memory device and configured to transmit a plurality of glitch signals and a plurality of control signals after the plurality of glitch signals for a write operation of the memory device according to a data signal,
wherein the test device is further configured to determine, based on write data of the data signal, whether bits of read data outputted in a read operation of the memory device are moved toward a first side to generate a test result indicating a disturbance to the write operation induced by the plurality of glitch signals,
wherein when the bits of the read data are moved toward the first side, compared with the write data, at least one mismatched bit between the read data and the write data has a logic high value.

2. The system of claim 1, wherein the test device is operatively coupled to first and second data strobe pins of the memory device which are configured to receive a differential data strobe signal pair wherein the differential data strobe signal pair comprises the plurality of control signals,
wherein the test device is further configured to output a first glitch signal of the plurality of glitch signals to the first data strobe pin and a second glitch signal, inverted from the first glitch signal, to the second data strobe pin.

3. The system of claim 1, wherein in the write operation, the memory device is configured to latch data of the data signal in response to at least three edges that are in a first glitch signal of the plurality of glitch signals and in a first control signal of the plurality of control signals.

4. The system of claim 3, wherein the first glitch signal has a first voltage level in a first interval and a second voltage level in a second interval after the first interval.

5. The system of claim 4, wherein when a ratio between the first and second intervals ranges from 0.025 to 0.075, the read data are inconsistent with the write data.

6. The system of claim 4, wherein when a ratio between the first and second intervals ranges from 0.15 to 0.25, the read data are consistent with the write data.

7. A system comprising:
a memory device comprising an input/output circuit; and
a test device that is configured to output a differential data strobe signal pair to first and second data strobepins of the memory device,
wherein the test device is further configured to output first and second glitch signals to the first and second data strobe pins, and output a plurality of control signals to the first and second data strobe pins after the first and second glitch signals are output,
wherein the input/output circuit is configured to latch, in response to the first and second glitch signals and the plurality of control signals, data for a write operation of a memory device,
wherein the test device is further configured to compare write data corresponding to the write operation and read data outputted in a read operation of the memory device to determine whether the memory device is disturbed by the first and second glitch signals,
wherein when the bits of the read data are moved toward a first side, compared with the write data, at least one mismatched bit between the read data and the write data has a logic high value.

8. The system of claim 7, wherein the test device is further configured to generate the first and second glitch signals at a first time and generate the plurality of control signal at a second time after the first time.

9. The system of claim 8, wherein the input/output circuit latches the data at a third time after the second time.

10. The system of claim 7, wherein the first glitch signal has a first voltage level in a first interval and has a second voltage level greater than the first voltage level in a second interval after the first interval,
wherein when a ratio between the first and second intervals is greater than 0.125, the read data are consistent with the write data.

11. The system of claim 7, wherein the first glitch signal has different voltage levels in a first interval and in a second interval after the first interval,
wherein when a ratio between the first and second intervals is smaller than 0.1, the write data are inconsistent with the read data.

12. A method, comprising:
generating a write data signal to a first pin of a memory device;
generating a glitch signal and a control signal to a second pin of the memory device;
latching data from the write data signal for a write operation in response to at least one of the glitch signal and the control signal;
performing a read operation to generate a read data signal; and
determining, based on write data signal, whether bits of the read data signal are moved toward a first side to generate a test result indicating a disturbance to the write operation induced by the glitch signal, wherein when the bits of the read data signal are moved toward a first side, compared with the write data signal, at least one mismatched bit between the read data signal and the write data signal has a logic high value.

13. The method of claim 12, wherein a duration of the glitch signal is shorter than a clock period of the memory device.

14. The method of claim 12, the glitch signal has a first voltage level in a first interval and has a second voltage in a second interval different from the first interval.

15. The method of claim 14, when the second interval is greater than the first interval, the read data signal is inconsistent with the write data signal.

16. The method of claim 14, further comprising:
displaying, by a display device, the write data signal and the read data signal for a comparison thereof.

* * * * *